United States Patent
Cummings et al.

(10) Patent No.: US 6,333,706 B1
(45) Date of Patent: Dec. 25, 2001

(54) BUILT-IN SELF-TEST FOR ANALOG TO DIGITAL CONVERTER

(75) Inventors: Brooks A. Cummings, Chittenden, VT (US); Douglas R. Firth, Thompkins, NY (US); Donald L. Wheater, Chittenden, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/365,424

(22) Filed: Aug. 2, 1999

(51) Int. Cl.[7] .................................................. H03M 1/10
(52) U.S. Cl. ............................................. 341/120; 341/155
(58) Field of Search ..................................... 341/118, 120, 341/155

(56) References Cited

U.S. PATENT DOCUMENTS

| | | | |
|---|---|---|---|
| 4,371,868 | * 2/1983 | Van de Grift et al. | 340/347 |
| 4,441,183 | 4/1984 | Dussault | 371/25 |
| 4,586,022 | * 4/1986 | Acuff | 340/347 |
| 4,843,395 | * 6/1989 | Morse | 341/156 |
| 5,132,685 | 7/1992 | DeWitt et al. | 341/120 |
| 5,184,162 | 2/1993 | Saitoh et al. | 324/158 R |
| 5,185,883 | 2/1993 | Ianni et al. | 395/575 |
| 5,225,834 | 7/1993 | Imai et al. | 341/120 |
| 5,258,986 | * 11/1993 | Zerbe | 371/21.2 |
| 5,305,003 | 4/1994 | Han | 341/120 |
| 5,574,733 | 11/1996 | Kim | 371/27 |
| 5,631,913 | 5/1997 | Maeda | 371/22.4 |
| 5,659,312 | 8/1997 | Sunter et al. | 341/120 |
| 5,784,383 | * 7/1998 | Meaney | 371/22.4 |

* cited by examiner

*Primary Examiner*—Peguy JeanPierre
(74) *Attorney, Agent, or Firm*—Wood, Phillips, VanSanten, Clark & Mortimer

(57) ABSTRACT

An on-chip analog to digital converter (ADC) test circuit comprises a waveform generator for developing a known arbitrary waveform. A switch selectively connects the waveform generator to the ADC in a test mode or an internal analog input to the ADC in an operate mode. In the test mode the ADC develops a known sequence of digital codes. A signature register is connected to an output of the ADC for receiving and compressing the sequence of digital codes during the test mode. The register develops a single compressed signature representative of the entire ADC digital output sequence. The compression method may be used to test ADC monotonicity, linearity, and that there are no missing codes.

22 Claims, 2 Drawing Sheets

BUILT-IN SELF-TEST FOR ANALOG TO DIGITAL CONVERTER

FIELD OF THE INVENTION

This invention relates to built-in self-test circuits for analog to digital converters and, more particularly, to a circuit that uses on-chip signature compression.

BACKGROUND OF THE INVENTION

Analog to digital converters (ADCS) are conventionally used to convert analog signals to digital codes or signals for processing. Dedicated ADC chips can be readily tested in manufacturing by applying a known analog input to the chip and evaluating the digital output. Many current microelectronic circuit chips embed the ADC with processors and other circuits. Embedded ADCs are difficult and time-consuming to test in manufacturing. Access to the digital output data to assess the behavior of the ADC may be difficult or impossible, particularly when testing at speed. The ADC can be tested using static techniques. Digital data is accessed via a serial scan path. However, a 16-bit ADC requires a prohibitive number of scan downloads (from a tester or test time perspective) to verify that the ADC is functional for every digital code.

On the analog input side of ADCS, ramp inputs have traditionally been the preferred technique to stimulate the ADC to exercise all of the digital output codes. This requires either special mixed signal automatic test equipment (ATE) or additional components on the tester to the device under test interface board.

The present invention is directed to solving one or more of the problems discussed above in a novel and simple manner.

SUMMARY OF THE INVENTION

Broadly, there is disclosed herein a built-in self-test (BIST) circuit for an analog to digital converter that uses on-chip signature compression.

Broadly, there is disclosed herein an on-chip analog to digital converter (ADC) test circuit comprising a waveform generator for developing a known arbitrary waveform. Switch means selectively connect the waveform generator to the ADC in a test mode or an internal analog input to the ADC in an operate mode. In the test mode the ADC develops a known sequence of digital codes. A signature register is connected to an output of the ADC for receiving and compressing the sequence of digital codes output from the ADC during the test mode and developing an output representative of the compressed sequence.

In one aspect of the invention, the waveform generator comprises a ramp generator.

In another aspect of the invention the waveform generator comprises an integrator. The integrator has an input connected to receive a clock signal from an external test circuit.

It is a feature of the invention that the signature register comprises a multiple input shift register (MISR) that compresses the sequence of digital codes. The MISR has an input for receiving digital codes from the ADC and updates the compressed sequence of digital codes responsive to a clock signal. The signature register includes a last value register storing a last digital code from the ADC and a comparator compares the last digital code to a current digital code and develops the clock signal if there is a change from the last digital code to the current digital code.

It is another feature of the invention that the signature register can compare the compressed sequence of digital codes to a stored sequence and the output represents the result of the comparison.

It is a further feature of the invention that the signature register includes an output control for transferring the compressed sequence of digital codes to an external test circuit. The output circuit comprises a scan chain or other observation mechanism.

In accordance with another aspect of the invention there is disclosed a built-in self test circuit on an electronic circuit chip including an ADC that converts an analog signal to a corresponding digital code. The circuit includes a waveform generator for developing a known arbitrary analog signal. A switch selectively connects either the waveform generator to an input of the ADC in a test mode, or an internal analog input to the ADC input in an operate mode. In the test mode the ADC develops a known sequence of digital codes. A signature register is connected to an output of the ADC for receiving and compressing the sequence of digital codes output from the ADC during the test mode and developing an output representative of the compressed sequence.

More particularly, the invention solves the problems discussed above by applying an on-chip signature compression to the output of the ADC. The entire transfer function of the ADC in response to the known arbitrary waveform is reduced to the contents of one on-chip signature register. Further, the input to the ADC is generated on-chip with automatic test equipment only supplying an enable or clock signal to the ADC input. This concept may be applied to any monolithic ADC, independent of architecture.

Further features and advantages of the invention will be readily apparent from the specification and from the drawings.

DETAILED DESCRIPTION OF THE INVENTION

Figure 1:
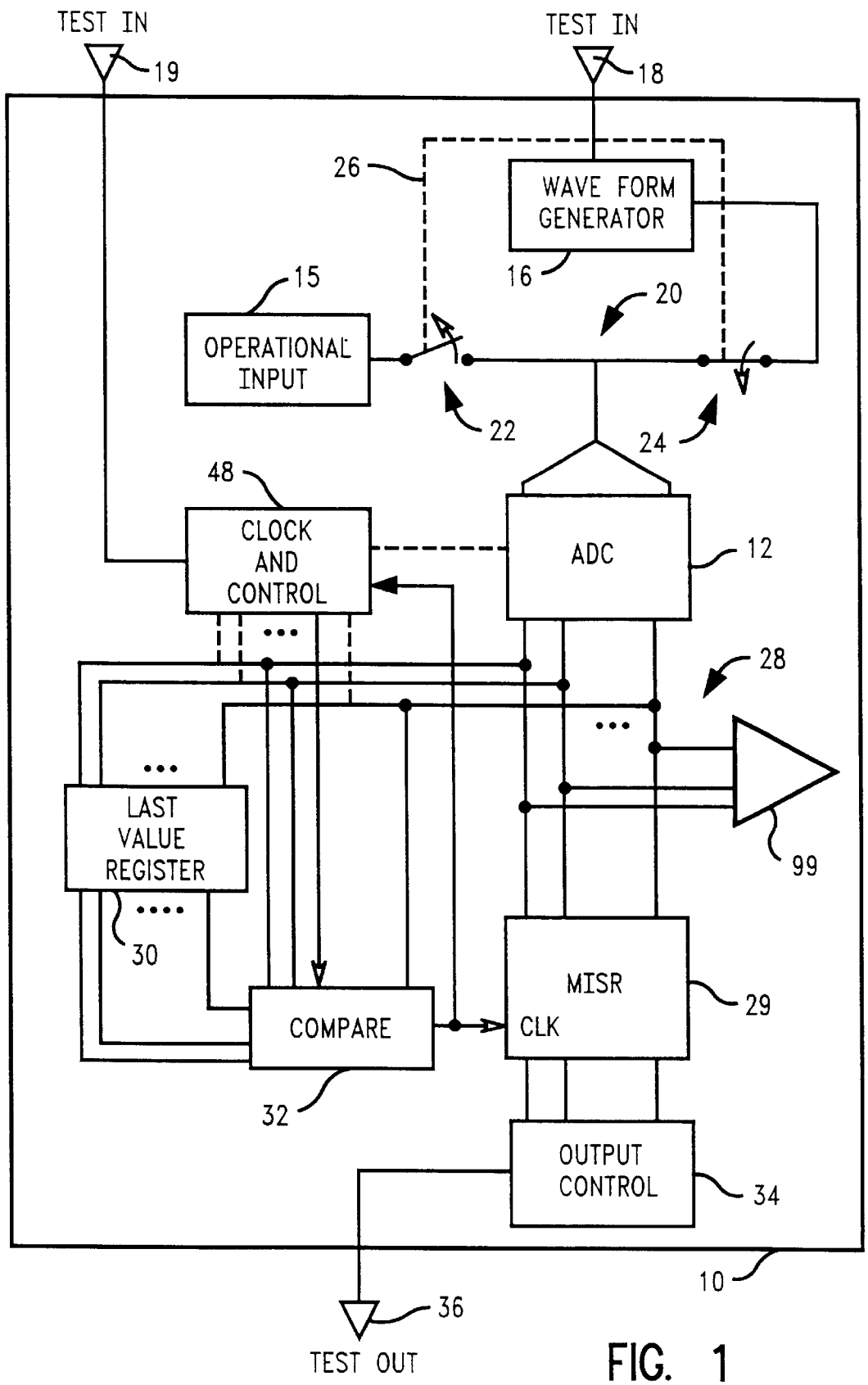
FIG. 1 is a block diagram of a built-in self test circuit for an analog to digital converter in accordance with the invention.

Referring initially to FIG. 1, an integrated microelectronic circuit chip is represented by a block 10. The chip 10 may include various circuits according to its particular application. The present invention deals particularly with such a chip 10 including an analog to digital converter (ADC) 12. More particularly, the present invention relates to the provision of a built-in self test (BIST) circuit 14 integrated on the chip 10 for testing operation of the ADC 12. The various other circuits that may be included on the chip 10 are not relevant to the present invention, and are therefore not disclosed or discussed herein.

For normal operation, in an operate mode, the ADC 12 receives an analog input from an operational input block 15. The operational input block 15 may develop the analog signal from the various other circuits, or the input may come from an external source, according to the particular application. The ADC 12 receives the analog input in the operate mode and converts the analog signal to a corresponding digital code. The digital code is then typically supplied to the various other circuits represented by a triangle 99.

The BIST circuit 14 includes a waveform generator 16 that develops a known arbitrary waveform. The waveform generator 16 is enabled or driven by a test input at a test terminal 18 from an external source. The waveform generator could, for example, develop a ramp waveform, either ramp-up or ramp-down, or a sinusoidal signal. In an illustrated embodiment of the invention, the waveform generator 16 comprises an integrator. The test input at the terminal 18 is a clock signal that clocks the integrator to develop a ramp signal.

The input to the ADC 12 is selectively connected to either the waveform generator 16 or the operational input block 15 via a switch circuit 20. The switch circuit 20 includes a first switch 22 and a second switch 24. In an operate mode, the first switch 22 is closed and the second switch 24 is opened. Conversely, in a test mode, the first switch 22 is open and the second switch 24 is closed, as illustrated. The switch 20 may take any known form. The switch 20 is controlled to normally bypass the waveform generator 16 so that the ADC 12 is connected to the operational input block 15. However, when the chip 10 is connected to automatic test equipment (ATE), and is configured to receive a signal at the test in terminal 18, then the switches are actuated, as represented by a dashed line 26.

In accordance with the invention, the BIST circuit 14 includes a signature register function 28 that uses a multiple input shift register (MISR) 29 connected to an output of the ADC 12. The ADC output is also connected to a last value register block 30 and a compare block 32. The last value register block 30 stores the output of the ADC 12 at the end of each operating cycle. The compare block 32 compares the stored value in the last value register to the present output during an operating cycle to determine if there has been a change in the ADC output. If there has been a change, then the compare block 32 develops a clock signal to the MISR 29. The MISR 29 receives and compresses the sequence of digital codes output from the ADC during the test mode. The output from the MISR 29 is supplied to an output control block 34 which develops an output representation of the compressed sequence supplied to a test out terminal 36.

A clock and control block 48 generates "conversion signals", i.e., clock signals, to the ADC 12 and to the compare block 32 either developed off its own oscillator or derived from an external test in signal 19. The frequency of the clocks is such that there are one or preferably more conversions per code change of the ADC 12 relative to the arbitrary waveform. If the waveform is a ramp (integrator), the clock and control block 48 can also verify linearity of the ADC 12 by counting the number of clocks between changes determined by the compare block 32 and seeing that they equal (within limits) for each ADC. Similarly, by increasing the clocking rate a maximum conversion rate may be verified.

Figure 2:
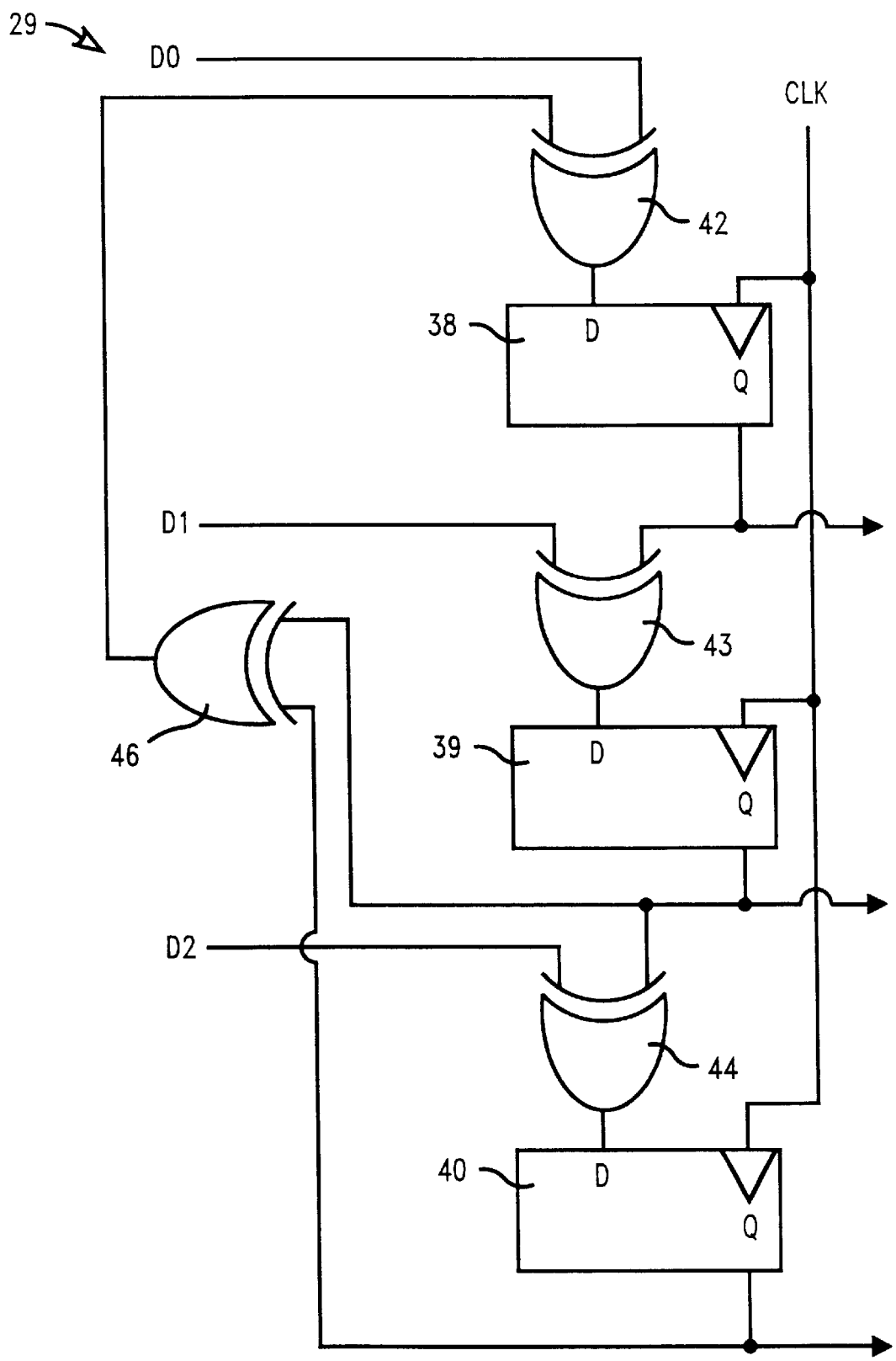
FIG. 2 is an electrical schematic of an exemplary multiple input shift register used with the circuit of FIG. 1.

The MISR 29 utilizes a well-known method of circuit response compression. FIG. 2 illustrates an exemplary 3-bit MISR. The MISR 29 includes three N flip-flops (FFs) 38, 39 and 40. The MISR 29 receives the output of the ADC 12, in this example represented by D0, D1 and D2. The data input of each flip-flop 38, 39 and 40 is connected to a respective exclusive-OR (XOR) gate 42, 43 and 44. The clock signal to each flip-flop 38–40 is supplied as discussed above.

The flip-flops 38–40 are connected together such that the outputs of the ADC 12 are XOR'ed with both the outputs of the FF, and a feedback look from the nth FF to the first FF using an XOR gate 46. The compressed signature comprises the outputs of the FFs 38–40, represented by the arrowheads.

As described, the MISR 29 collects and compresses all the digital output codes into a single signature. After the test is completed, this signature can be compared to an ideal signature, stored in the output control 34 for pass or fail evaluation. Alternatively, the output control 34 can pass the signature out to the terminal 36. To do so, the output control 34 may utilize a scan chain or other means for providing the signature to the test out terminal 36 or multiple terminals.

The following describes the test implemented by the circuit 14. When the test in terminal 18 is enabled, according to the particular form of the waveform generator 16, the waveform generator 16 applies its known arbitrary waveform to the ADC 12 via the switch 24. The ADC 12 is clocked, causing it to start to convert the analog input to a digital code. The first converter code is loaded into the MISR 29 and the last value register 30. The ADC is clocked again. The new converter code is compared to the code contained in the last value register 30. If different, then the new code is loaded into the MISR and the signature changes. This new code also replaces the previous one in the last value register 30. If the code is the same, then the new code is not loaded into the MISR to prevent errors in testing. These steps are repeated as the waveform generator 16 progresses through its entire range. At the completion of the test, the signature stored in the MISR 29 is compared with a known good signature, either on-chip or using the ATE.

The BIST circuit 14 requires very little hardware overhead for tests. Even if a scan chain is used, the scan chain is normally required to observe the ADC output. The analog BIST solution makes it possible to perform embedded core testing which may be too complex for implementation on automatic test equipment. The circuit also tests the ADC for missing codes, monotonicity, full scale range, and linearity.

Thus, in accordance with the invention, the BIST circuit provides a self-contained test which is application independent. The test can be performed on inexpensive digital ATE at greatly reduced test time. The ADC device is tested at speed, with minimal testability circuit overhead.

We claim:

1. An on-chip analog to digital converter (ADC) test circuit comprising:

a waveform generator for developing a known arbitrary waveform;

switch means for selectively connecting the waveform generator to the ADC in a test mode or an internal analog input to the ADC in an operate mode, whereby in the test mode the ADC develops a known sequence of digital codes;

a signature register connected to an output of the ADC for receiving and compressing the sequence of digital codes output from the ADC during the test mode and developing an output representative of the compressed sequence.

2. The test circuit of claim 1 wherein the waveform generator comprises a ramp generator.

3. The test circuit of claim 1 wherein the waveform generator comprises an integrator.

4. The test circuit of claim 3 wherein the integrator has an input connected to receive a clock signal from an external test circuit.

5. The test circuit of claim 1 wherein the signature register comprises a multiple input shift register (MISR) that compresses the sequence of digital codes.

6. The test circuit of claim 5 wherein the MISR has an input for receiving digital codes from the ADC and updates the compressed sequence of digital codes responsive to a clock signal.

7. The test circuit of claim 6 wherein the signature register includes a last value register storing a last digital code from the ADC and a comparator compares the last digital code to a current digital code and develops the clock signal if there is a change from the last digital code to the current digital code.

8. The test circuit of claim 1 wherein the signature register compares the compressed sequence of digital codes to a stored sequence and the output represents the result of said comparison.

9. The test circuit of claim 1 wherein the signature register includes an output control for transferring the compressed sequence of digital codes to an external test circuit.

10. The test circuit of claim 9 wherein the output circuit comprises a scan chain.

11. The test circuit of claim 1 wherein logic in the test circuit verifies linearity and maximum conversion rate, no missing codes, monotonicity, and full scale range.

12. A built in self test circuit on an electronic circuit chip including an analog to digital converter (ADC) that converts an analog signal to a corresponding digital code, comprising:
   a waveform generator for developing a known arbitrary analog signal;
   a switch selectively connecting either the waveform generator to an input of the ADC in a test mode or an internal analog input to the ADC input in an operate mode, whereby in the test mode the ADC develops a known sequence of digital codes;
   a signature register connected to an output of the ADC for receiving and compressing the sequence of digital codes output from the ADC during the test mode and developing an output representative of the compressed sequence.

13. The built in self test circuit of claim 12 wherein the waveform generator comprises a ramp generator.

14. The built in self test circuit of claim 12 wherein the waveform generator comprises an integrator.

15. The built in self test circuit of claim 14 wherein the integrator has an input connected to receive a clock signal from an external built in self test circuit.

16. The built in self test circuit of claim 12 wherein the signature register comprises a multiple input shift register (MISR) that compresses the sequence of digital codes.

17. The built in self test circuit of claim 16 wherein the MISR has an input for receiving digital codes from the ADC and updates the compressed sequence of digital codes responsive to a clock signal.

18. The built in self test circuit of claim 17 wherein the signature register includes a last value register storing a last digital code from the ADC and a comparator compares the last digital code to a current digital code and develops the clock signal if there is a change from the last digital code to the current digital code.

19. The built in self test circuit of claim 12 wherein the signature register compares the compressed sequence of digital codes to a stored sequence and the output represents the result of said comparison.

20. The built in self test circuit of claim 12 wherein the signature register includes an output control for transferring the compressed sequence of digital codes to an external test circuit.

21. The built in self test circuit of claim 20 wherein the output circuit comprises a scan chain.

22. The test circuit of claim 12 wherein logic in the test circuit verifies linearity and maximum conversion rate, no missing codes, monotonicity, and full scale range.

* * * * *